United States Patent
Ebert et al.

(10) Patent No.: US 7,725,798 B2
(45) Date of Patent: May 25, 2010

(54) METHOD FOR RECOVERING INFORMATION FROM CHANNEL-CODED DATA STREAMS

(75) Inventors: Johannes Ebert, Graz (AT); Wilfried Gappmair, Graz (AT)

(73) Assignees: Joanneum Research Forschungsgesellschaft mbH, Graz (AT); Technische Universität Graz Institut für Kommunikationsnetze und Satellitenkommunikation, Graz (AT)

( * ) Notice: Subject to any disclaimer, the term of this patent is extended or adjusted under 35 U.S.C. 154(b) by 1101 days.

(21) Appl. No.: 11/065,337

(22) Filed: Feb. 24, 2005

(65) Prior Publication Data

US 2005/0204260 A1   Sep. 15, 2005

Related U.S. Application Data

(60) Provisional application No. 60/607,785, filed on Sep. 7, 2004.

(30) Foreign Application Priority Data

Feb. 27, 2004  (AT) ............................ GM146/2004

(51) Int. Cl.
*H03M 13/00*    (2006.01)
(52) U.S. Cl. ................... 714/755; 714/792; 714/795
(58) Field of Classification Search ............. 714/792, 714/801, 755, 795
See application file for complete search history.

(56) References Cited

U.S. PATENT DOCUMENTS

| | | | | |
|---|---|---|---|---|
| 6,577,678 B2 * | 6/2003 | Scheuermann | ............... | 375/222 |
| 7,230,978 B2 * | 6/2007 | Bitterlich et al. | ............ | 375/219 |
| 7,246,298 B2 * | 7/2007 | Chiueh et al. | ............... | 714/755 |
| 2001/0052099 A1 * | 12/2001 | Yano et al. | ................... | 714/755 |
| 2001/0052104 A1 * | 12/2001 | Xu et al. | ...................... | 714/792 |
| 2003/0014711 A1 * | 1/2003 | Yuan | ......................... | 714/786 |
| 2003/0091129 A1 * | 5/2003 | Zhang et al. | ................ | 375/340 |
| 2004/0005019 A1 | 1/2004 | Smith et al. | | |
| 2005/0278603 A1 * | 12/2005 | Berens et al. | ............... | 714/755 |

FOREIGN PATENT DOCUMENTS

DE         102 14 393 A1     2/2003

* cited by examiner

*Primary Examiner*—Sam Rizk
(74) *Attorney, Agent, or Firm*—Henry M. Feiereisen; Ursula B. Day

(57) ABSTRACT

A method and system for recovering useful information, in particular useful information transmitted in digital form on terrestrial or satellite-based information paths, for example as voice, image or data signal, from channel-coded data streams encoded with turbo codes with a predefined code rate is disclosed. The data streams are received by a turbo decoder with a presettable number of decoder components and subsequently decoded in an iterative process according to the MAP and/or Max-Log-MAP standard. The iterative process is controlled by a stop criterion, wherein after termination of the iterative process in the turbo decoder at least one of the decoder components, in particular the associated lattice diagram, is used for an additional decoding process that is different from the MAP and/or Max-Log-MAP standard. This approach lowers the error floor of the turbo code.

15 Claims, 1 Drawing Sheet

METHOD FOR RECOVERING INFORMATION FROM CHANNEL-CODED DATA STREAMS

CROSS-REFERENCES TO RELATED APPLICATIONS

This application claims the priority of Austrian Patent Application, Serial No. GM 146/2004, filed Feb. 27, 2004, pursuant to 35 U.S.C. 119(a)-(d), and which claims the benefit of prior filed U.S. provisional Application No. 60/607,785, filed Sep. 7, 2004, pursuant to 35 U.S.C. 119(e).

BACKGROUND OF THE INVENTION

The present invention relates to a method and system for recovering useful information, in particular voice, image or data signals, from data streams having channels encoded by turbo codes and transmitted in digital form on terrestrial or satellite-based information paths with a predefined code rate.

Nothing in the following discussion of the state of the art is to be construed as an admission of prior art.

Turbo codes are parallel-concatenated hash codes that represent a particularly efficient method for channel-coding. Systems based on transmission via turbo codes to provide forward error correction (FEC) are increasingly used in modern communication systems and in many commonly used recommendations and standards, such as for example the fourth-generation mobile communication standard UMTS, or the transmission standard for extra-terrestrial communication CCSDS. Turbo codes significantly increase the efficiency of a communication system without requiring a dedicated return channel, if the FEC code is appropriately selected and parameterized.

One of the characteristic features of turbo codes is an error floor.

If the signal-to-noise ratio per bit ($E_b/N_0$: energy contrast ratio per bit) is increased in a common block code or hash code, then the error rate decreases more or less rapidly. The situation is different with turbo codes: although the error rate decreases rapidly with increasing $E_b/N_0$ (convergence range) at the beginning, it becomes flat thereafter (error floor); the further curve shape is determined asymptotically by the so-called free distance. The aforementioned error floor is a characteristic feature of the turbo code and can be relatively large in variations with a low computing complexity, so that they may be useless for practical applications.

One way to lower the error floor is to increase the memory size in the encoder components which, however, exponentially increases the complexity of the decoder and is therefore impractical. Alternatively, the block length could be increased, which however has limitations in many cases.

It would therefore be desirable to provide a method and a device for lowering the error floor without increasing the computing complexity.

SUMMARY OF THE INVENTION

According to one aspect of the present invention, a method for recovering useful information from channel-coded data streams encoded with turbo codes with a predefined code rate includes the steps of iteratively decoding the data streams according to the MAP and/or Max-Log-MAP standard by using a defined number of decoder components, applying a stop criterion to terminate the iterative decoding process, and after termination of the iterative decoding process, additionally decoding a data stream in at least one of the decoder components with a decoding process that is different from the MAP or Max-Log-MAP standard.

According to another aspect of the present invention, a system for recovering useful information from channel-coded data streams encoded with turbo codes with a predefined code rate, includes a decoder with a defined number of decoder components for iteratively decoding the data streams according to the MAP and/or Max-Log-MAP standard, and a stop engine terminating the iterative decoding process in response to a stop criterion. After termination of the iterative decoding process, at least one of the decoder components additionally decodes the data stream in with a decoding process that is different from the MAP or Max-Log-MAP standard.

In this way, the characteristic error floor of a turbo code can be lowered significantly, for example by up to two orders of magnitude, while using the existing hardware and with only an insignificant increase in the computing power. This significantly broadens the applications for turbo codes, because in general only decoding methods with small computing complexity can be employed due to the limited system power. In addition, the error probability can be reduced in existing telecommunications systems, which broadens their practical applicability, because signals can be reliably decoded with a smaller signal-to-noise ratio. The lattice diagrams are frequently also referred to as trellis.

According to another feature of the present invention, the additional different decoding operation can be implemented with a Viterbi scheme. This approach not only allows use of the same hardware, but also obviates the need for additional test information, thereby retaining the same bandwidth requirement. The computing complexity also increases only slightly, because a Viterbi stage requires significantly less computing power than the Max-Log-MAP stages used with the iterative decoding process.

According to another feature of the present invention, the useful information can be encoded in an encoder by permutating a data sequence with an interleaver operating according to the semi-random or S-random principle. The channel-coded data streams can be decoded in a decoder by permutating the channel-coded data streams with a de-interleaver also operating according to the semi-random or S-random principle, thus further reducing the error floor.

According to another feature of the present invention, devisor polynomials and dividend polynomials of shift registers of the encoder can be defined, with the devisor polynomials having an order of three, four or five. The devisor polynomials together with dividend polynomials completely describe at least one of the decoder components. In this way, the optimum result is achieved with a low computing power and sufficient code efficiency.

According to yet another feature of the present invention, a remaining register content of components of the encoder can be transmitted following the transmission of a data block of the data sequence, and the trellis of a corresponding decoder component can be terminated with the remaining register content, thereby further reducing the error floor.

According to another feature of the present invention, the remaining register content can be transmitted channel-coded, preferably as a repeat code, which ensures that the decoder components are terminated with the correct data.

The useful information can be transmitted in digital form on a terrestrial or satellite-based information path, and can include voice, image or data signals.

BRIEF DESCRIPTION OF THE DRAWING

Other features and advantages of the present invention will be more readily apparent upon reading the following description of currently preferred exemplified embodiments of the invention with reference to the accompanying drawing, in which.

DETAILED DESCRIPTION OF PREFERRED EMBODIMENTS

Figure 1:
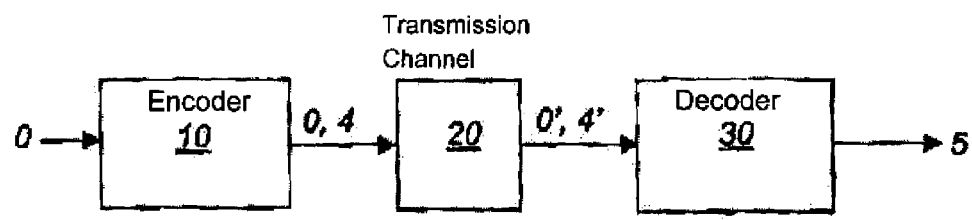
FIG. 1 is a schematic diagram of a communication system.

Throughout all the Figures, same or corresponding elements are generally indicated by same reference numerals. These depicted embodiments are to be understood as illustrative of the invention and not as limiting in any way. It should also be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

Turning now to the drawing, and in particular to FIG. 1, there is shown in form of a schematic block diagram a communication system with an encoder 10, a transmission channel 20 and a decoder 30. The encoder 10 receives a data stream 0 and encodes the data steam 0 into an un-encoded bit stream 0 (useful data) and a parity stream 4. The un-encoded bit stream 0 and the parity stream 4 are received by decoder 30 as un-encoded bit stream 0' (useful data) and parity stream 4' and converted into decoded binary data, as described below.

Figure 3:
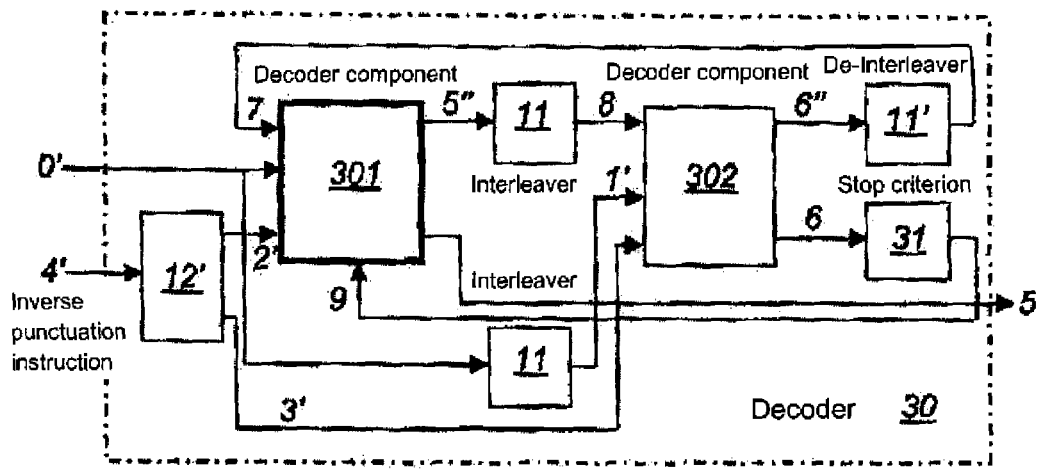
FIG. 3 is a schematic block diagram of a hybrid turbo/Viterbi decoder.

Referring now to FIG. 3, the depicted exemplary hybrid turbo/Viterbi decoder 30 can apply the method of the invention for recovering useful information, in particular useful information transmitted in digital form on terrestrial or satellite-based information paths, for example as voice, image or data signal, from channel-coded data streams 0', 4' that are encoded with turbo codes with a predefined code rate. The data streams 0', 4' are received by a turbo decoder 30 and subsequently decoded in an iterative process according to the MAP and/or Max-Log-MAP standard, wherein a presettable number of decoder components 301, 302, in particular lattice diagrams, are provided for the MAP and/or Max-Log-MAP standard and the iterative process is controlled by a stop criterion. After the iterative process is terminated, at least one of the decoder components 301, 302, in particular their lattice diagram, is used in the turbo decoder 30 for an additional decoding operation. Such lattice diagrams are typically referred to as trellis.

FIG. 3 represents only one of many possibilities for constructing a turbo/Viterbi decoder 30, because the decoder 30 must be matched to the encoder 10, and in particular to the data structure of the received data 0', 4' to be decoded.

Figure 2:
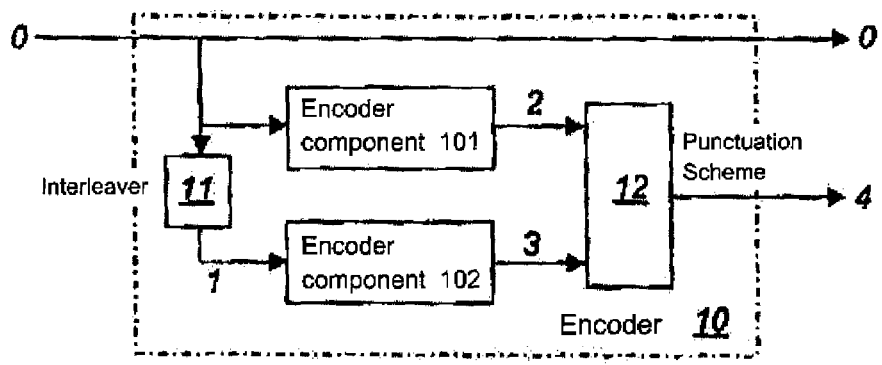
FIG. 2 shows a turbo encoder.

The corresponding encoder 10 is depicted in FIG. 2 and includes two encoder components 101, 102 with parallel shift registers which in practice operate mostly symmetrically, but always recursively. The register structures which can be identical are uniquely determined by the devisor polynomial and the dividend polynomial. In this way, two parity streams 2 and 3 (coded data) can be generated from the un-encoded bit stream 0 (useful data).

It should be noted that FIG. 2, as FIG. 3 for the decoder 30, represents only one of many possibilities for implementing a turbo encoder 10. In particular, the number of the encoder components 101, 102 and the number of the interleavers 11, sometimes also referred to as permuters or scramblers, must be adapted to the respective application and may in certain embodiments deviate more or less from the basic design.

It is characteristic for turbo codes that the un-encoded data stream 0 is also transmitted, as indicated in FIG. 2. Another significant aspect is the separation of the bit streams at the input of the shift register by an interleaver 11. Accordingly, the bit stream 1 at the output of the interleaver or 11 is therefore a permutated version of the bit stream 0. The selected permutation principle directly affects the efficiency of the code. The pseudo-random principle has proven to be advantageous for turbo codes. However, it has been found that the error floor can be further reduced with the method according to the invention for recovering the useful information by using an interleaver 11 or a de-interleaver 11' that operates according to the semi-random (S-random) principle.

It will be understood that the selected permutation principle must be used both in the encoder 10 and in the decoder 30. Due to the employed principle, application of the method according to the invention is not limited to the semi-random, so-called S-random principle, by any known or future permutation principle can be employed with the method of the invention as long as the efficiency of the encoding method of the invention can be increased.

It should be noted that the method of the invention operates with arbitrary block lengths and code rates. If both parity streams 2 and 3 are transmitted in addition to the un-encoded bit stream 0, then the code rate is R=⅓. The circuit according to FIG. 2 can be easily extended to values R=1/n, wherein n is an integer>2, by implementing n-1 parallel branches which are suitably separated at the input by interleavers. Rational numbers for R>⅓ (for example ½, ⅔ or ¾) can be readily implemented by a so-called punctuation scheme 12 at the output of encoder 10. A punctuation scheme 12 corresponds to a matrix that combines the incoming parity streams 2 and 3 into a parity stream 4, whereby individual check bits are omitted according to a periodic pattern, with the reduced redundancy increasing the code rate. The punctuation scheme 12 must be known to the decoder 30.

In a preferred embodiment, the decoder components 301, 302 of the turbo decoder 30 are implemented as a lattice diagram (trellis). However, any other suitable implementation can be used. Decoder structures constructed by lattice diagrams are completely described in a known manner by the devisor and dividend polynomials used in the encoder 10. The method of the invention is not limited to a particular order of the two polynomials; however, only those circuits are useful where the order of the dividend polynomial is smaller than or equal to the order of the devisor polynomial. A comparison of the desired efficiency and acceptable complexity has shown that third, fourth and fifth order devisor polynomials are advantageous in practice. It will be understood that the order of the devisor and dividend polynomials can be increased commensurate with the available computer power.

The original form of turbo decoders 30 follows the MAP (maximum a posteriori) principle which guarantees optimum symbolic decoding. MAP algorithms are implemented with the help of lattice diagrams, with a separate lattice diagram generated for each of the encoder components. Lattice diagrams represent a uniquely invertible image of the corresponding encoder component 101, 102, whereby the encoder component 101, 102 can be viewed as an automaton with a finite number of states, with an input symbol from a finite alphabet uniquely determining for each state the transition symbol and the following state (finite state machine).

Because the MAP complexity is very high and therefore requires substantial computer power, the simpler Max-Log-MAP variant is used, as described, for example, in B. Vucetic and J Yuan, "Turbo Codes: Principle and Applications"; KAP 2000. Because the Max-Log-MAP stages 301 and 302 represents the counterpart of the encoder components 101 and 102 of FIG. 2, the inputs 0' and 4' are labeled accordingly, whereby the apostrophe suggests that the corresponding symbols arrive at the turbo decoder 30 with noise caused by the transmission over the transmission channel 20 (see FIG. 1). If a punctuation scheme 12 is implemented at the transmitter side to generate code rates $R>\frac{1}{3}$, then the received parity stream 4' must be separated before the decoding process with the help of the inverse punctuation instruction 12' into the parity streams 2' and 3' for the decoder components 301 and 302, respectively. In addition, the un-encoded data stream 0' must also pass through the interleaver 11 to ensure that the symbols for the decoder component 302 are present in the same sequential order as in the encoder component 102 of FIG. 2.

Unlike a Viterbi decoder, which operates with software decisions only at the input, but provides at the output binary information for further processing, the Max-Log-MAP stages implemented in the decoder components 301 and 302 generate soft decisions also at the output.

Turbo decoders 30 have a more advantageous error characteristic when so-called extrinsic information, indicated in FIG. 3 with 5'' and 6'', is used for the iterative process. This is a result of the soft decisions at the output of the decoder components 301 and 302, after subtraction of the soft decisions for the systematic information 0' and 1' and of the a priori information 7 and 8. Regarding the latter, as depicted in FIG. 3, the information 8 is nothing else but the extrinsic information 5'' permutated by the interleaver 11, whereas the information 7 represents the extrinsic information 6'' permutated by the de-interleaver 11'. The de-interleaver 11' performs the inverse permutation function of 11, so that the symbols can be looped back to the decoding stage 301 in the proper sequence.

In known applications of turbo codes, the decoding process is stopped by executing a predefined number of iterations or by implementing a stop criterion 31, for example at the soft decision output 6 of the Max-Log-MAP stages 302. This criterion can in its simplest form be implemented by comparing the hard decisions from 6 for two consecutive data blocks; if these are identical, then the iterative decoding process is terminated and the binary information (hard decisions) are outputted in the correct order. This process would correspond to the classic turbo decoder 30. Any known or future stop criterion can be implemented with the method of the invention.

When the stop criterion 31 is triggered, the intrinsic information 6'' is transmitted to the input of the decoder component 301 as soft decision information 7. When the stop criterion is applied, the trellis of the decoder components 301, via the control line 9, is no longer used in the last step for a Max-Log-MAP stage, and another suitable decoding principle or decoding scheme can be used for decoding. According to the invention, any decoding method, principle or scheme that further lowers the error floor can be used.

According to a preferred embodiment of the method of the invention, the additional decoding operation is implemented with a Viterbi scheme, with the binary output 5 of the Viterbi scheme transmitting the decoded data to the following processing stage. The error floor of the employed turbo code can be thereby be lowered further by selecting suitable code parameters, which opens the possibility to apply the turbo code in other novel telecommunication systems with limited computing power or to improve the reception quality of existing telecommunications systems.

In FIG. 3, the block performing the additional decoding is framed by a heavy line to indicate the difference between the decoder components 301 and 302. While block 302 executes only the Max-Log-MAP process, the Viterbi decoder is started in the decoder component 301 via the same trellis after termination of the iterative turbo process.

It should be noted that the Viterbi decoder increases the computing complexity only slightly because it is used only once, i.e., at the end of the decoding process, and because it requires significantly less computer power than a Max-Log-MAP stage. Advantageously, the method of the invention requires no additional redundancy, so that the required bandwidth remains unchanged.

According to a preferred application of the method of the invention, the remaining register content of the encoder components 101, 102 is transmitted after transmission of a data block, whereby the trellis of the corresponding decoder components 301, 302 of the decoder 30 is terminated with the remaining register content. This approach further lowers the error floor.

Because the corresponding data are also transmitted over the transmission channel 20 to the decoder 30 and can be expected to arrive at the decoder 30 with superimposed noise, the remaining register content is transmitted channel-coded, preferable as a repeat code.

Finally, it should be pointed out that the method of the invention is not a concatenated scheme of turbo code and Viterbi code, but rather a hybrid solution.

While the invention has been illustrated and described in connection with currently preferred embodiments shown and described in detail, it is not intended to be limited to the details shown since various modifications and structural changes may be made without departing in any way from the spirit of the present invention. The embodiments were chosen and described in order to best explain the principles of the invention and practical application to thereby enable a person skilled in the art to best utilize the invention and various embodiments with various modifications as are suited to the particular use contemplated.

What is claimed as new and desired to be protected by Letters Patent is set forth in the appended claims and includes equivalents of the elements recited therein:

What is claimed is:

1. A method for recovering useful information from channel-coded data streams encoded with turbo codes with a predefined code rate, comprising:

iteratively decoding the data streams according to the MAP and/or Max-Log-MAP standard by using a defined number of decoder components, applying a stop criterion to terminate said iterative decoding process, and after termination of said iterative decoding process, additionally decoding the resultant data stream in at least one of the decoder components with a decoding process implemented with a Viterbi scheme.

2. The method of claim 1, further comprising encoding the useful information in an encoder by permutating a data sequence with an interleaver operating according to the semi-random or S-random principle, and decoding the channel-coded data streams in a decoder by permutating the channel-coded data streams with a de-interleaver operating according to the semi-random or S-random principle.

3. The method of claim 2, further comprising defining devisor polynomials and dividend polynomials of shift registers of the encoder, said devisor polynomials having an order of three, four or five, wherein the devisor polynomials together with dividend polynomials completely describe at least one of the decoder components.

4. The method of claim 2, further comprising transmitting a remaining register content of components of the encoder following the transmission of a data block of the data sequence, and terminating a trellis of a corresponding decoder component with the remaining register content.

5. The method of claim 4, wherein the remaining register content is transmitted channel-coded.

6. The method of claim 4, wherein the remaining register content is transmitted as a repeat code.

7. The method of claim 1, wherein the useful information is transmitted in digital form on a terrestrial or satellite-based information path.

8. The method of claim 1, wherein the useful information comprises a voice, image or data signal.

9. A system for recovering useful information from channel-coded data streams encoded with turbo codes with a predefined code rate, comprising:
- a decoder with a defined number of decoder components for iteratively decoding the data streams according to the MAP and/or Max-Log-MAP standard, and
- a stop engine terminating said iterative decoding process in response to a stop criterion,
- wherein after termination of said iterative decoding process, at least one of the decoder components additionally decodes the data stream with a decoding process that employs a Viterbi scheme.

10. The system of claim 9, further comprising an encoder with an interleaver operating of the semi-random or S-random principle and permutating an input data sequence, wherein the decoder includes a de-interleaver that also operates according to the semi-random, or S-random principle and permutates the channel-coded data streams.

11. The system of claim 10, wherein the encoder further comprises shift registers defined by devisor polynomials and dividend polynomials, said devisor polynomials having an order of three, four or five, wherein the devisor polynomials together with dividend polynomials completely describe at least one of then decoder components.

12. The system of claim 10, wherein the encoder transmits a remaining register content of the encoder components following the transmission of a data block of the data block, causing the decoder to terminate a trellis of a corresponding decoder component with the remaining register content.

13. The system of claim 12, wherein the remaining register content is transmitted channel-coded, preferably as a repeat code.

14. The system of claim 9, wherein the useful information is transmitted in digital form on a terrestrial or satellite-based information path.

15. The system of claim 9, wherein the useful information comprises a voice, image or data signal.

* * * * *